United States Patent
Zimmermann et al.

(10) Patent No.: US 11,214,147 B2
(45) Date of Patent: Jan. 4, 2022

(54) VEHICLE INTERIOR COMPONENT

(71) Applicant: Shanghai Yanfeng Jinqiao Automotive Trim Systems Co. Ltd., Novi, MI (US)

(72) Inventors: Jochen Zimmermann, Wuppertal (DE); Bogdan Muresan, Neuss (DE); Radisa Göritz-Stamencic, Bad Schmiedeberg (DE); Tobias Birth, Gummersbach (DE); Kai Brensel, Witten (DE); Christian Schirp, Bochum (DE); Torsten Tiebe, Werl (DE)

(73) Assignees: Shanghai Yanfeng Jinqiao Automotive Trim Systems Co. Ltd., Novi, MI (US); Leopold KOSTAL GmbH & Co. KG, Ludenschied (DE)

( * ) Notice: Subject to any disclaimer, the term of this patent is extended or adjusted under 35 U.S.C. 154(b) by 0 days.

(21) Appl. No.: 17/326,236

(22) Filed: May 20, 2021

(65) Prior Publication Data
US 2021/0268907 A1    Sep. 2, 2021

Related U.S. Application Data

(63) Continuation of application No. PCT/US2019/061730, filed on Nov. 15, 2019.
(Continued)

(51) Int. Cl.
*B60K 37/00* (2006.01)
*B60Q 3/14* (2017.01)

(52) U.S. Cl.
CPC ............... *B60K 37/00* (2013.01); *B60Q 3/14* (2017.02); *B60K 2370/332* (2019.05);
(Continued)

(58) Field of Classification Search
CPC ........ B60K 2370/332; B60K 2370/336; B60K 2370/339; B60K 2370/34; B60K 2370/688; B60K 37/00; B60Q 3/14
See application file for complete search history.

(56) References Cited

U.S. PATENT DOCUMENTS

| | | | |
|---|---|---|---|
| 2,924,863 | A | 2/1960 | Chavannes |
| 3,796,069 | A | 3/1974 | Statler |

(Continued)

FOREIGN PATENT DOCUMENTS

| | | |
|---|---|---|
| CN | 205476256 U | 8/2016 |
| DE | 2 803 539 A1 | 8/1979 |

(Continued)

OTHER PUBLICATIONS

International Search Report and Written Opinion received for PCT Application Serial No. PCT/US2019/61730 dated Mar. 30, 2020, 33 pages.

*Primary Examiner* — William N Harris
(74) *Attorney, Agent, or Firm* — Amin, Turocy & Watson, LLP (57) ABSTRACT

A vehicle interior component is disclosed. The component may provide visible light and may comprise a base, a decorative module and a light source. The decorative module may comprise an angled surface to direct light toward an inner/textured/nonplanar surface of the decorative module. The inner surface may reflect light. The decorative module may allow light to pass through the inner surface toward an outer surface of the decorative module. The component may comprise a light directing layer comprising a substantially reflective front side adjacent the inner surface of the decorative module and a substantially transparent back side.

16 Claims, 6 Drawing Sheets

Related U.S. Application Data (60) Provisional application No. 62/770,883, filed on Nov. 23, 2018.

(52) U.S. Cl.
CPC .. *B60K 2370/336* (2019.05); *B60K 2370/339* (2019.05); *B60K 2370/34* (2019.05); *B60K 2370/688* (2019.05)

(56) References Cited

U.S. PATENT DOCUMENTS

| | | | |
|---|---|---|---|
| 4,045,269 | A | 8/1977 | Voss et al. |
| 5,197,792 | A | 3/1993 | Jiao et al. |
| 5,440,428 | A | 8/1995 | Hegg et al. |
| 6,214,266 | B1 | 4/2001 | Millif et al. |
| 6,504,928 | B1 | 1/2003 | Toyooka |
| 6,548,128 | B2 | 4/2003 | Auld et al. |
| 6,595,667 | B1 | 7/2003 | obata |
| 6,752,946 | B2 | 6/2004 | Toyooka |
| 7,666,497 | B2 | 2/2010 | Takatsuki et al. |
| 8,236,383 | B2 | 8/2012 | Gasworth et al. |
| 8,783,922 | B2 | 7/2014 | Ichihara et al. |
| 8,926,107 | B2 | 1/2015 | Geyl et al. |
| 9,016,913 | B2 | 4/2015 | Englert |
| 9,090,009 | B2 | 7/2015 | Deckert et al. |
| 9,354,376 | B2 | 5/2016 | Englert |
| 9,597,825 | B2 | 3/2017 | Schmidt et al. |
| 9,599,308 | B2 | 3/2017 | Ender et al. |
| 9,720,500 | B2 | 8/2017 | Hotchkiss et al. |
| 9,902,265 | B2 * | 2/2018 | Lathrop ................ B60K 37/06 |
| 10,192,522 | B2 | 1/2019 | Fujita et al. |
| 10,196,010 | B2 | 2/2019 | Hass et al. |
| 10,449,911 | B2 | 10/2019 | Stossel et al. |
| 10,864,851 | B2 | 12/2020 | Eitel et al. |
| 2002/0131261 | A1 | 9/2002 | Inui et al. |
| 2003/0011546 | A1 | 1/2003 | Obata et al. |
| 2003/0148044 | A1 | 8/2003 | Auld et al. |
| 2004/0037087 | A1 | 2/2004 | Desai |
| 2005/0276874 | A1 | 12/2005 | Menaldo et al. |
| 2009/0286072 | A1 | 11/2009 | Kuchler et al. |
| 2010/0141134 | A1 | 6/2010 | Werners et al. |
| 2011/0002138 | A1 | 1/2011 | Hayes et al. |
| 2011/0025488 | A1 * | 2/2011 | Leon ................ F16H 59/08 340/456 |
| 2012/0048177 | A1 | 3/2012 | Tomono et al. |
| 2012/0057342 | A1 * | 3/2012 | Shih ................ G02B 6/006 362/235 |
| 2012/0200475 | A1 | 8/2012 | Baker et al. |
| 2015/0017404 | A1 | 1/2015 | Gayer et al. |
| 2015/0219913 | A1 | 8/2015 | Lee et al. |
| 2016/0221498 | A1 * | 8/2016 | Vourlat ................ B60Q 3/82 |
| 2016/0272111 | A1 | 9/2016 | Teng et al. |
| 2016/0349442 | A1 | 12/2016 | Berard et al. |
| 2017/0046043 | A1 | 2/2017 | Karg et al. |
| 2017/0106785 | A1 | 4/2017 | Nakajima |
| 2017/0144344 | A1 | 5/2017 | Schmidt et al. |
| 2017/0206831 | A1 | 7/2017 | Schmittat |
| 2018/0029264 | A1 | 2/2018 | Sharron et al. |
| 2018/0056788 | A1 | 3/2018 | Boron et al. |
| 2018/0178736 | A1 | 6/2018 | Schelter |
| 2019/0308552 | A1 * | 10/2019 | Dominick .............. B60K 35/00 |

FOREIGN PATENT DOCUMENTS

| | | |
|---|---|---|
| DE | 197 02 977 C2 | 2/2001 |
| DE | 101 18 178 C2 | 5/2003 |
| DE | 101 23 344 B4 | 9/2005 |
| DE | 20 2006 017 445 U1 | 8/2007 |
| DE | 20 2007 015 946 U1 | 4/2008 |
| DE | 10 2008 041 701 A1 | 3/2010 |
| DE | 10 2012 110 153 A1 | 8/2013 |
| DE | 10 2011 050 585 B4 | 5/2014 |
| DE | 10 2015 101 013 A1 | 7/2016 |
| DE | 20 2016 104 031 U1 | 7/2017 |
| DE | 20 2016 104 100 U1 | 8/2017 |
| DE | 20 2017 105 057 U1 | 8/2017 |
| DE | 20 2017 105 880 U1 | 9/2017 |
| DE | 20 2017 105 883 U1 | 9/2017 |
| DE | 20 2017 104 082 U1 | 7/2018 |
| DE | 20 2017 104 262 U1 | 7/2018 |
| DE | 20 2017 104 984 U1 | 8/2018 |
| DE | 20 2017 105 063 U1 | 8/2018 |
| DE | 10 2013 202 223 B4 | 6/2019 |
| DE | 10 2013 003 659 B4 | 7/2019 |
| EP | 0 598 706 A1 | 5/1994 |
| EP | 1 314 612 B1 | 1/2007 |
| EP | 2 099 950 B1 | 5/2012 |
| EP | 2 145 796 B1 | 9/2012 |
| EP | 2 269 797 B1 | 11/2013 |
| EP | 2 233 366 B1 | 3/2014 |
| EP | 2 060 443 B1 | 8/2016 |
| EP | 3 100 915 A1 | 12/2016 |
| EP | 2 684 744 B1 | 5/2018 |
| EP | 3 110 627 B1 | 6/2018 |
| EP | 3 303 063 B1 | 3/2019 |
| FR | 2 540 441 A1 | 8/1984 |
| FR | 2 803 791 B1 | 7/2002 |
| FR | 2 920 120 A1 | 2/2009 |
| FR | 2 920 717 A1 | 3/2009 |
| JP | 3021188 B2 | 3/2000 |
| JP | 5336276 B2 | 11/2013 |
| KR | 10-1628364 B1 | 6/2016 |
| WO | 2012/085922 A1 | 6/2012 |
| WO | 2017/217642 A1 | 12/2017 |

* cited by examiner

FIG. 6F  100c

VEHICLE INTERIOR COMPONENT

CROSS-REFERENCE TO RELATED APPLICATION

The present application is a continuation of PCT/International Patent Application No. PCT/US19/61730 titled "VEHICLE INTERIOR COMPONENT" filed Nov. 15, 2019, which claims the benefit of U.S. Provisional Patent Application No. 62/770,883 titled "VEHICLE INTERIOR COMPONENT" filed Nov. 23, 2018.

The present application claims priority to and incorporates by reference in full the following patent application(s): (a) U.S. Provisional Patent Application No. 62/770,883 titled "VEHICLE INTERIOR COMPONENT" filed Nov. 23, 2018; (b) PCT/International Patent Application No. PCT/US19/61730 titled "VEHICLE INTERIOR COMPONENT" filed Nov. 15, 2019.

FIELD

The present invention relates to a vehicle interior component.

BACKGROUND

It is known to provide a vehicle interior component with a decorative appearance.

It would be advantageous to provide an improved vehicle interior component with a decorative appearance and configured to present a user interface for an occupant of the vehicle.

SUMMARY

The present invention relates to a vehicle interior component configured to provide light intended to be visible to an occupant in the vehicle when in operation after installation in the interior of the vehicle comprising a base, a decorative module coupled to the base comprising an outer surface and an inner surface, a first light source, a second light source and a light directing layer coupled to the inner surface of the decorative module. The decorative module may comprise an angled surface configured to direct light from the first light source toward the inner surface of the decorative module. The inner surface of the decorative module may be configured to reflect light from the first light source. The decorative module may be configured to allow light from the second light source to pass through the inner surface of the decorative module toward the outer surface of the decorative module. The light directing layer may comprise a substantially reflective front side adjacent the inner surface of the decorative module and a substantially transparent back side. The component may comprise a panel coupled to the light directing layer; the panel may comprise a substantially opaque portion and a substantially transparent portion; the substantially opaque portion may be configured to reflect light from the second light source to prevent light from the second light source to pass through the inner surface of the decorative module toward the outer surface of the decorative module. The substantially transparent portion may be configured to allow light from the second light source to pass through the inner surface of the decorative module toward the outer surface of the decorative module. The panel may comprise at least one of (a) a film; (b) a foil.

The present invention relates to a vehicle interior component configured to provide light from a light system comprising a light source to provide direct lighting and a light source to provide indirect lighting configured to present a user interface that is illuminated for an occupant of the vehicle comprising a base comprising a passage configured for light from the light source to provide direct lighting, a light guide adjacent the base configured for light from the light source to provide indirect lighting, a panel comprising indicia aligned with the passage, a decorative module providing a core and a base surface, a cover providing an exterior surface configured to present the user interface using light from the light source and a sensor configured for interaction at the exterior surface. The decorative module may comprise an inner surface configured to reflect light from the light source to provide indirect lighting. The decorative module may comprise a surface configured to direct light from the light source to provide indirect lighting toward the inner surface of the decorative module. The decorative module may be configured to allow light from the light source to provide direct lighting through the passage to the panel comprising indicia aligned with the passage so that the user interface may be configured to be illuminated by light from the light system comprising direct lighting at the indicia of the panel and indirect lighting at the base surface of the decorative module. The decorative module may comprise (1) a glass surface bonded by an adhesive and (2) a coating to provide a reflective surface for the glass surface. The indicia may comprise printing on the glass surface to cover the reflective surface. The component may comprise light chutes for separate lighting of the indicia.

The present invention relates to a vehicle interior component configured to provide light intended to present a user interface in the interior of the vehicle comprising a base, a decorative module coupled to the base comprising an outer surface and an inner surface, a first light source, a second light source and a light-reflecting layer coupled to the inner surface of the decorative module. The decorative module may comprise a surface configured to direct light from the first light source toward the inner surface of the decorative module. The inner surface of the decorative module may be configured to reflect light from the first light source. The decorative module may be configured to allow light from the second light source to pass through the inner surface of the decorative module toward the outer surface of the decorative module. The light-reflecting layer may comprise a substantially reflective front side adjacent the inner surface of the decorative module. The light-reflecting layer may be configured to reflect light from the outer surface and/or the first light source. The light-reflecting layer may be configured to pass light through from the second light source. The light reflecting layer may comprise a layer applied by a process comprising at least one of (a) metal deposition; (b) vapor deposition; (c) sputtering; (d) physical vapor deposition (PVD); (e) chemical vapor deposition (CVD).

The present invention relates to a vehicle interior component configured to provide light intended to present a user interface in the interior of the vehicle comprising a base, a decorative module coupled to the base comprising an outer surface and an inner surface, a first light source, a second light source, a light directing layer and a panel coupled to the light directing layer. The decorative module may comprise a surface configured to direct light from the first light source toward the inner surface of the decorative module. The inner surface of the decorative module may be configured to reflect light from the first light source. The decorative module may be configured to allow light from the second light source to pass through the inner surface of the decorative module toward the outer surface of the decorative module. The panel may comprise a substantially opaque portion and a substantially transparent portion. The substantially opaque portion may be configured to block light from the second light source or to prevent light from the second light source to pass through the inner surface of the decorative module toward the outer surface of the decorative module. The substantially transparent portion may be configured to allow light from the second light source to pass through the inner surface of the decorative module toward the outer surface of the decorative module. The panel may comprise at least one of (a) a film; (b) a foil.

The present invention relates to a vehicle interior component configured to provide light from a light source comprising a first light source and a second light source to present a user interface comprising symbols for an occupant of the vehicle comprising a base comprising passages configured for light from the first light source, a light guide adjacent the base configured to direct light from the second light source, a panel comprising indicia aligned with the passage, a decorative module providing a core and a base surface and a top surface, a cover providing an exterior surface configured to present the user interface using light from the light source and a sensor configured for interaction at the exterior surface so that the user interface is configured for interaction by at least one of output by illumination at the decorative module and/or input by detection from the sensor. The user interface configured to appear at the exterior surface of the cover may be configured to present illumination of indicia comprising the symbols to appear at a near distance and illumination of the base surface to appear at a distance beyond the symbols. The decorative module may comprise an inner surface configured to reflect light from the light source to provide indirect lighting; the decorative module may comprise a surface configured to direct light from the light source to provide indirect lighting toward the inner surface of the decorative module; the decorative module may be configured to allow light from the light source to provide direct lighting through the passage to the panel comprising indicia aligned with the passage. The user interface may be configured to be illuminated by light comprising direct lighting at the indicia of the panel and indirect lighting at the base surface of the decorative module. The user interface may be configured to present illumination of indicia comprising the symbols to appear at a near distance and illumination of the base surface to appear behind the symbols. The component may comprise light chutes for separate lighting of the indicia.

The present invention relates to a vehicle interior component configured to provide light intended to be visible to an occupant in the vehicle when in operation after installation in the interior of the vehicle comprising a base, a decorative module coupled to the base comprising an outer surface and an inner surface, a first light source and a second light source. The decorative module may comprise an angled surface configured to direct light from the first light source toward the inner surface of the decorative module. The inner surface of the decorative module may be configured to reflect light from the first light source. The decorative module may be configured to allow light from the second light source to pass through the inner surface of the decorative module toward the outer surface of the decorative module. The inner surface of the decorative module may comprise a nonplanar surface. The inner surface of the decorative module may comprise a textured surface. The angled surface of the decorative module may comprise at least one of (a) a coating; (b) a film. The at least one of (a) the coating; (b) the film may be configured to reflect light. The vehicle interior component may comprise a light directing layer coupled to the inner surface of the decorative module. The light directing layer may comprise a substantially reflective front side adjacent the inner surface of the decorative module and a substantially transparent back side. The vehicle interior component may comprise a panel coupled to the light directing layer. The panel may comprise a substantially opaque portion and a substantially transparent portion. The substantially opaque portion may be configured to reflect light from the second light source to prevent light from the second light source to pass through the inner surface of the decorative module toward the outer surface of the decorative module. The substantially transparent portion may be configured to allow light from the second light source to pass through the inner surface of the decorative module toward the outer surface of the decorative module. The panel may comprise at least one of (a) a film; (b) a foil. The decorative module may comprise a light guide. The vehicle interior component may comprise a cover. The cover may comprise at least one of (a) glass; (b) plastic; (c) polycarbonate; (d) poly(methyl methacrylate); (e) acrylic; (f) acrylic glass; (g) a transparent thermoplastic material. The cover may comprise an inner surface and an outer surface. The inner surface of the cover may comprise at least a portion configured to prevent visibility of at least one of (a) the base; (b) the angled surface of the decorative module. The vehicle interior component may comprise a sensor. The sensor may comprise at least one of (a) an electrical circuit (b) an interactive layer (c) a capacitive switch (d) a capacitive switch sensor; (e) a sensor array.

The present invention also relates to a vehicle interior component configured to provide light from a light source to present a user interface for an occupant of the vehicle comprising a base comprising a passage configured for light from the light source, a light guide adjacent the base configured for light from the light source, a panel comprising indicia aligned with the passage, a decorative module providing a core and a base surface, a cover providing an exterior surface configured to present the user interface using light from the light source and a sensor configured for interaction at the exterior surface. The light guide may comprise a set of light guides along the base. The light guide may comprise a first light guide and a second light guide separated by the decorative module. The light guide may be configured to direct light toward the decorative module. The decorative module may comprise an angled surface configured to direct light from the light source toward the base surface of the decorative module. The vehicle interior component may be configured to present the user interface using light from the light source (a) guided through the light guide toward the decorative module, (b) reflected by an angled surface of the decorative module toward the base surface of the decorative module and (c) reflected by the base surface of the decorative module toward the sensor array. The vehicle interior component may be configured to present the user interface using light from the light source (a) guided through the passage of the base toward the indicia of the panel, (b) guided through the indicia of the panel toward the base surface of the decorative module and (c) guided through the base surface of the decorative module toward the sensor array. The sensor array may be configured for interaction in alignment with the indicia of the panel. The light source may comprise a first LED and a second LED. The first LED may be configured to direct light toward the light guide; the second light source may be configured to direct light toward the indicia of the panel. The cover may comprise at least one of (a) glass; (b) plastic; (c) polycarbonate; (d) poly(methyl methacrylate); (e) acrylic; (f) acrylic glass; (g) a transparent thermoplastic material. The cover may comprise a glass material in a thickness in a range from greater than 1 mm to about 4 mm and with an edge treatment. The glass material may be hot-formed; the edge treatment may comprise a chamfer; the thickness may be at least 2 mm and generally uniform.

DESCRIPTION

Figures 1A, 1B:
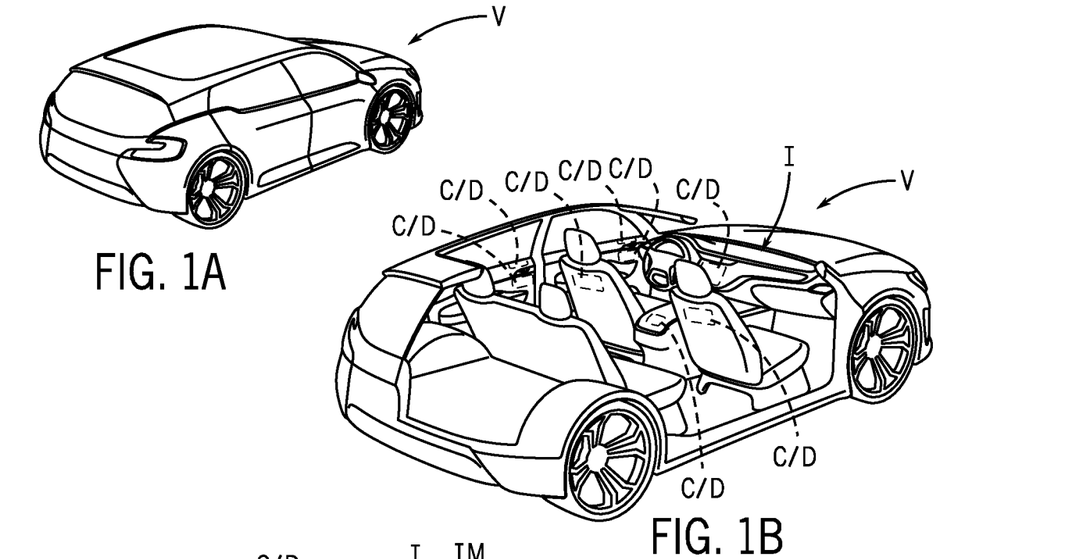
FIG. 1A is a schematic perspective view of a vehicle according to an exemplary embodiment.
FIG. 1B is a schematic perspective cut-away view of a vehicle showing an interior according to an exemplary embodiment.
Figure 1C:
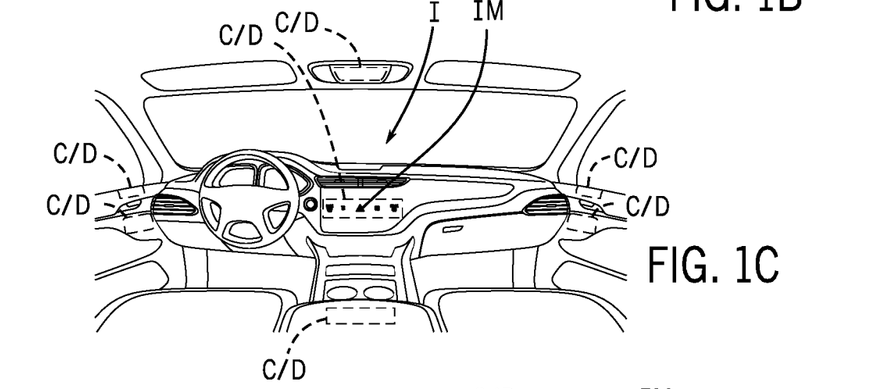
FIGS. 1C and 1D are schematic rear views of a vehicle showing an interior according to an exemplary embodiment.
Figure 1D:
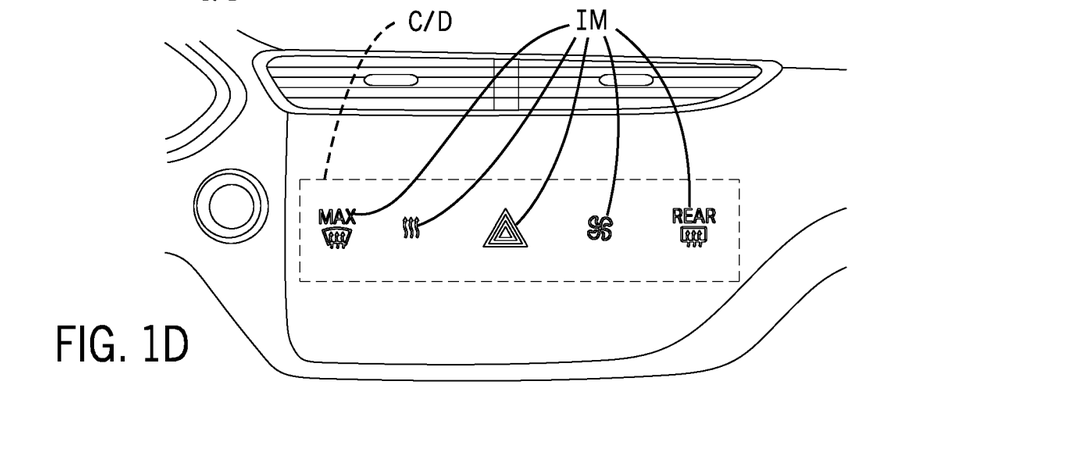

According to an exemplary embodiment as shown schematically in FIGS. 1A to 1C, a vehicle V may include a vehicle interior I. The vehicle interior may provide components C such as panels, consoles, compartments, etc. Components C may provide a display D (e.g. display panel, illumination, data display, display screen, etc.) to present information, alerts, entertainment, data, etc. to a vehicle occupant (e.g. data/information as may be available from various sources such as image IM as shown in FIGS. 1C and 1D). The vehicle interior may be provided with a variety of display configurations in a variety of positions and locations to serve a variety of purposes.

According to an exemplary embodiment, the component may comprise a trim component, panel, console, etc. provided within the vehicle interior (e.g. instrument panel, door, seat area, cockpit, center area, overhead, etc.).

As indicated schematically according to an exemplary embodiment, the display D of the component may present an image IM and/or information (e.g. data/information, instrumentation, indicators, controls, entertainment, communications, etc.). See e.g. FIGS. 1C and 1D. According to an exemplary embodiment, the component C and/or display D (if provided on the component) may provide a contoured form/shape designed/intended to integrate with the interior design/aesthetic of the vehicle V. According to an exemplary embodiment, the component C may be provided with a visual effect and formed (e.g. shaped/contoured).

Figure 2:
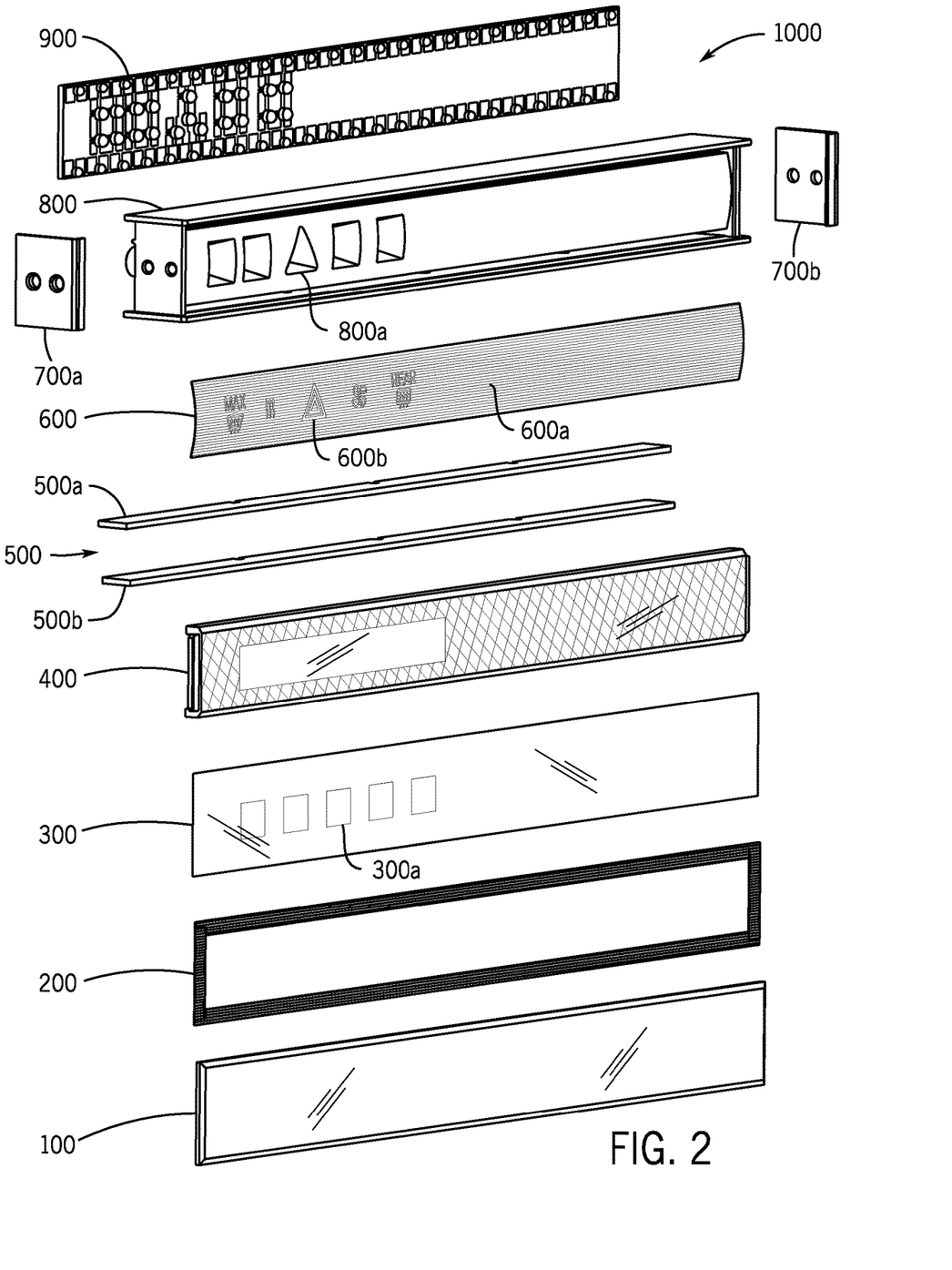
FIG. 2 is a schematic exploded view of a vehicle interior component according to an exemplary embodiment.
Figure 3A:
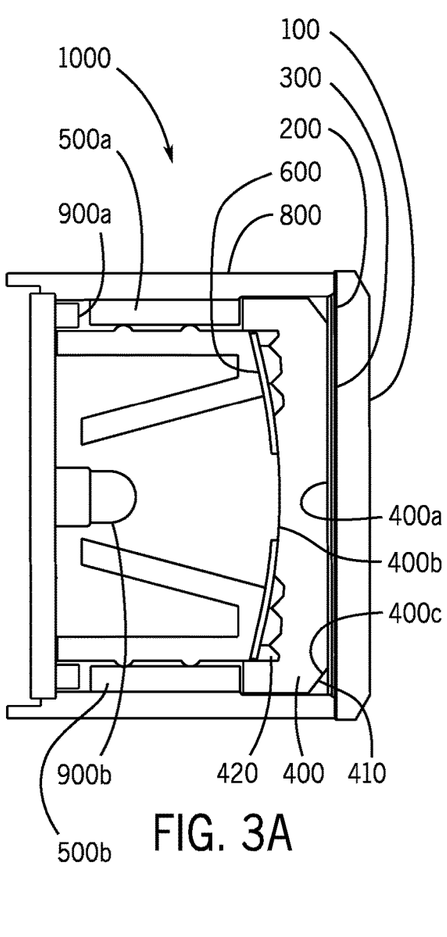
FIGS. 3A through 3C are schematic section views of a vehicle interior component according to an exemplary embodiment.
Figure 3B:
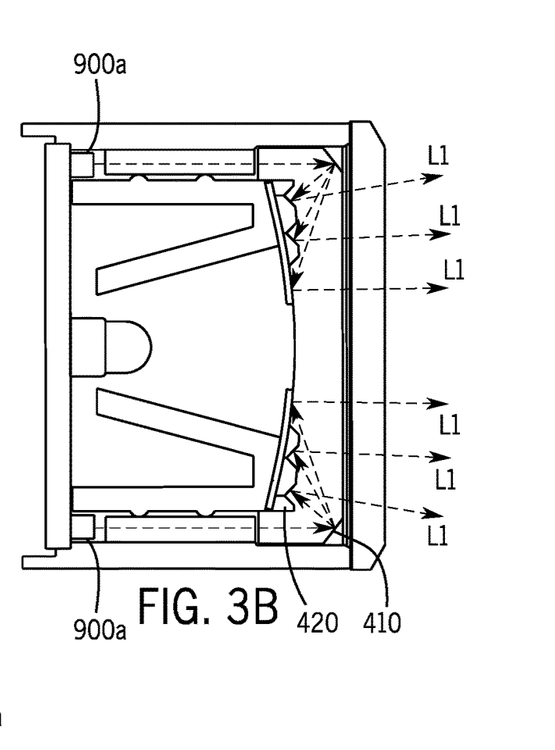
Figure 3C:
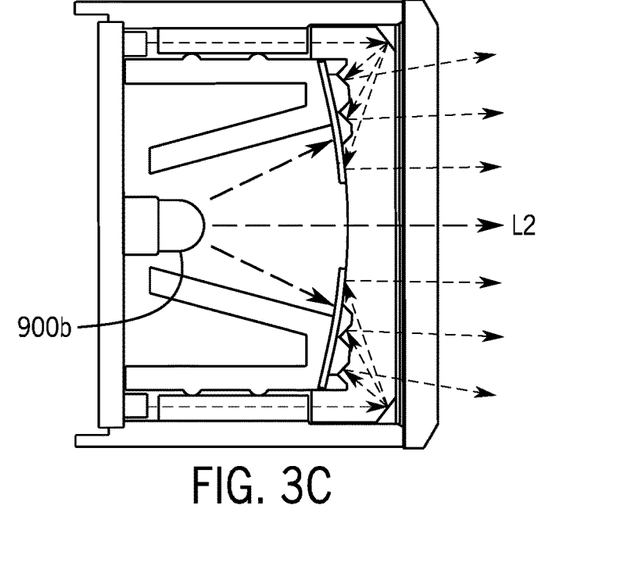
Figure 4A:
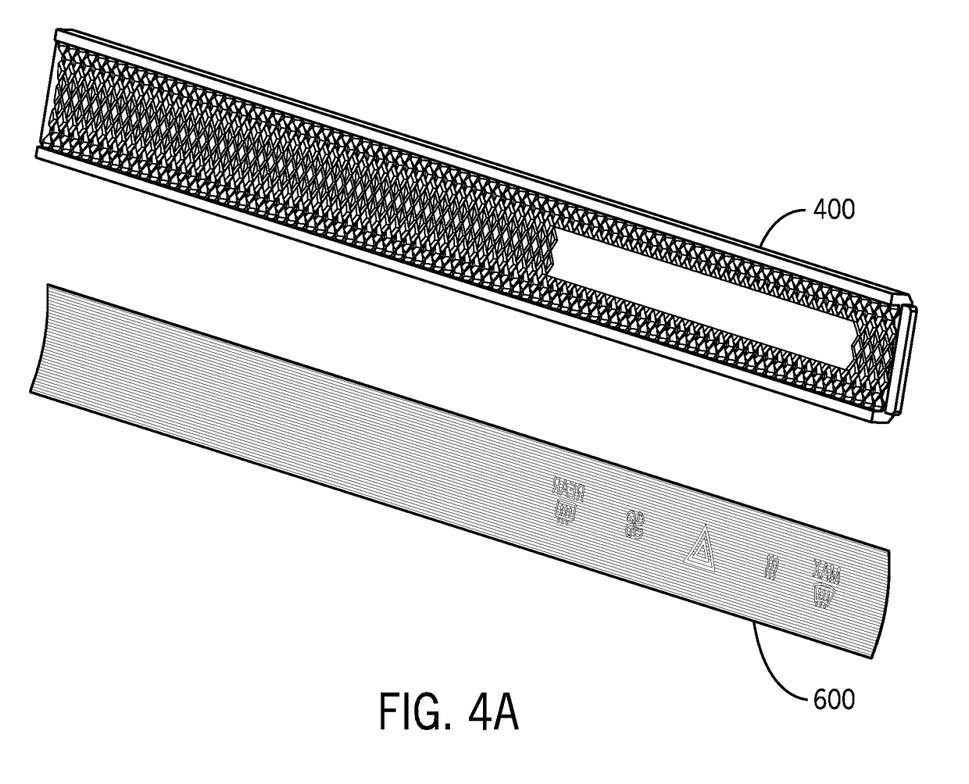
FIG. 4A is a schematic partial exploded rear perspective view of a vehicle interior component according to an exemplary embodiment.
Figure 4B:
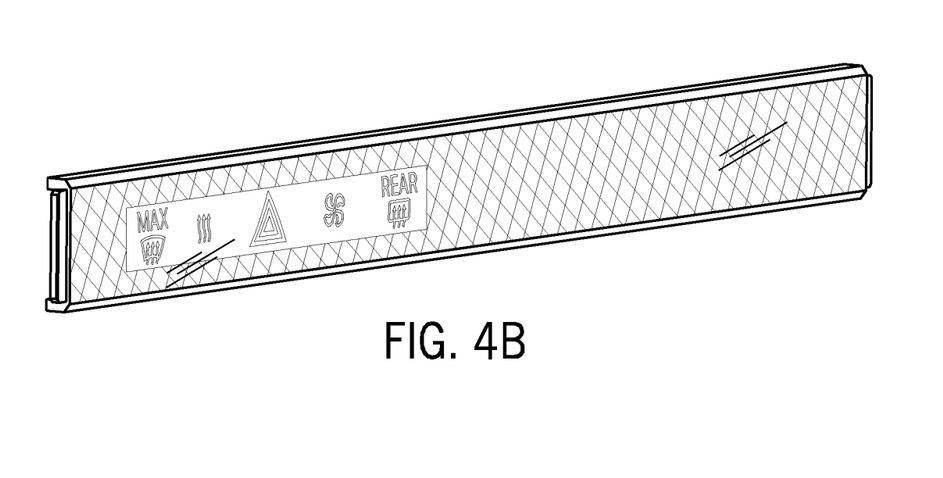
FIG. 4B is a schematic partial perspective view of a vehicle interior component according to an exemplary embodiment.

According to an exemplary embodiment as shown schematically in FIG. 2, a vehicle interior component 1000 may comprise at least one of (a) a decorative module 400, (b) a light guide 500, (c) a panel 600, (d) a base 800, (e) a light source 900. Vehicle interior component 1000 may further comprise at least one of (a) a cover 100/100a/100b/100c, (b) a mask 200; (c) a sensor 300: (d) an end cap 700. Vehicle interior component 1000 may comprise a trim component, panel, console, etc. provided within a vehicle interior (e.g. instrument panel, door, seat area, cockpit, center area, overhead, etc.).

Decorative Module 400 may comprise at least one of (a) a decorative layer; (b) a light guide; (c) a three dimensionally structured light guide. Decorative module 400 may comprise at least one of (a) an outer surface 400a; (b) an inner/base surface 400b; (c) an angled surface 400c. Decorative Module 400 may comprise at least one of (a) a first reflective layer 410; (b) a second reflective layer 420. First reflective layer 410 may be coupled to angled surface 400c. Second reflective layer 420 may be coupled to inner/base surface 400b. At least one of (a) first reflective layer 410; (b) second reflective layer 420 may comprise a coating. At least one of (a) first reflective layer 410; (b) second reflective layer 420 may be formed by physical vapor deposition.

Light guide 500 may comprise at least one of (a) a top light guide 500a; (b) a bottom light guide 500b. Panel 600 may comprise an opaque portion 600a and a clear portion/indicia 600b. End cap 700 may comprise at least one of (a) a first end cap 700a; (b) a second end cap 700b. Base 800 may comprise a passage 800a.

Cover 100/100a/100b/100c may comprise at least one of (a) glass; (b) plastic; (c) polycarbonate; (d) poly(methyl methacrylate); (e) acrylic; (f) acrylic glass; (g) a transparent thermoplastic material. Cover 100/100a/100b/100c may comprise a glass material in a thickness in a range from greater than 1 mm to about 4 mm and with an edge treatment. The glass material may be hot-formed; the edge treatment may comprise a chamfer; the thickness may be at least 2 mm and generally uniform. The edge treatment may comprise a radiused corner. The radiused corner may comprise a radius substantially equal to the thickness of the glass material. The edge treatment may comprise at least one of (a) a double radius; (b) a bullnose; (c) a half bullnose; (d) a full bullnose. The thickness of the glass material may facilitate an edge treatment comprising at least one of (a) a radiused corner; (b) a double radius; (c) a bullnose; (d) a half bullnose; (e) a full bullnose. See FIGS. 6A-6F.

Sensor 300 may comprise at least one of (a) an interactive layer; (b) a functional foil; (c) a sensor array. Sensor 300 may comprise a portion 330a aligned with indicia 600b of panel 600.

Light source 900 may comprise at least one of (a) a first light source 900a; (b) a second light source 900b. First light source 900a may be configured to provide light L1. Second light source 900b may be configured to provide light L2. Light source 900 may comprise a set of light emitting diodes.

Figure 5:
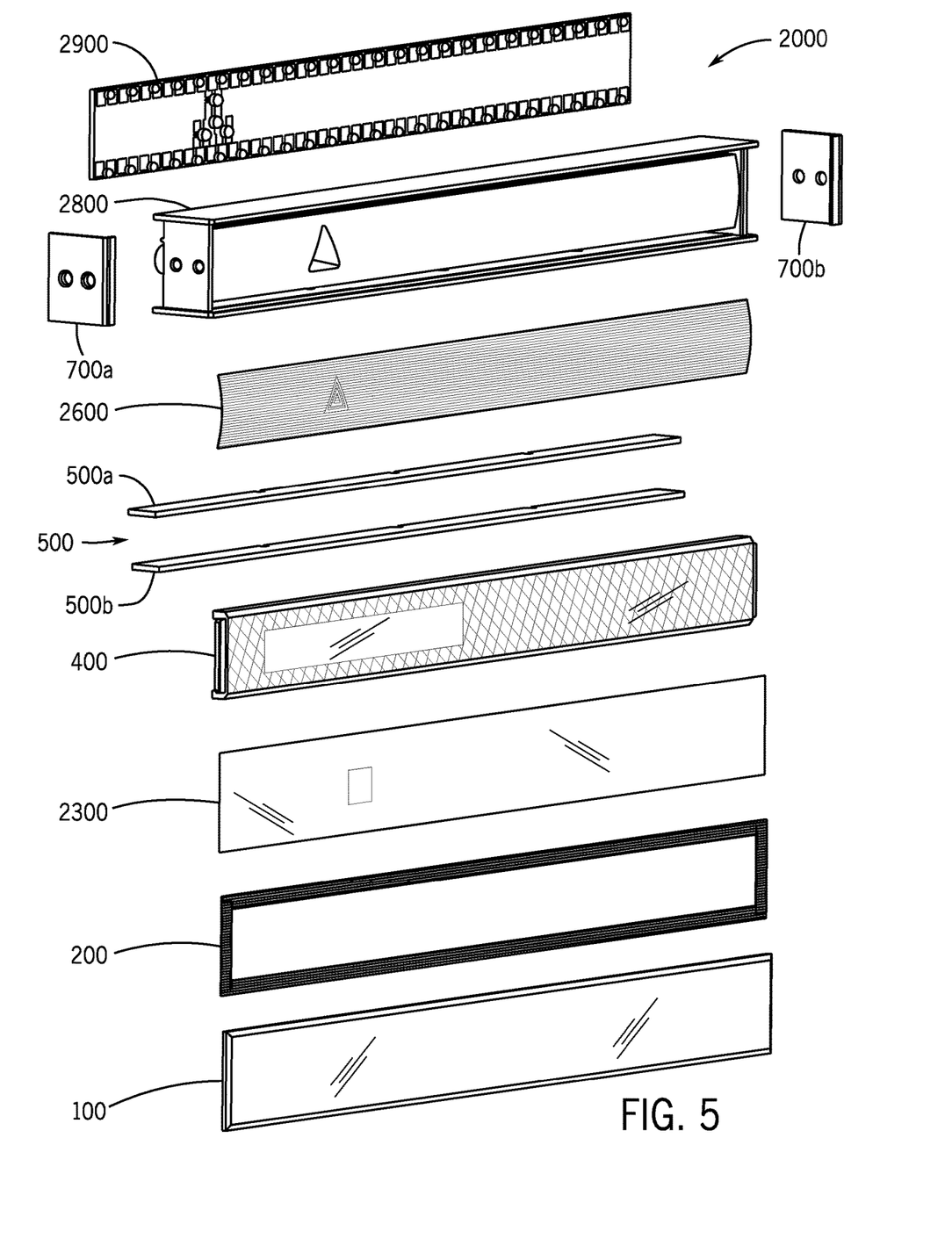
FIG. 5 is a schematic exploded view of a vehicle interior component according to an exemplary embodiment.
Figure 6A:
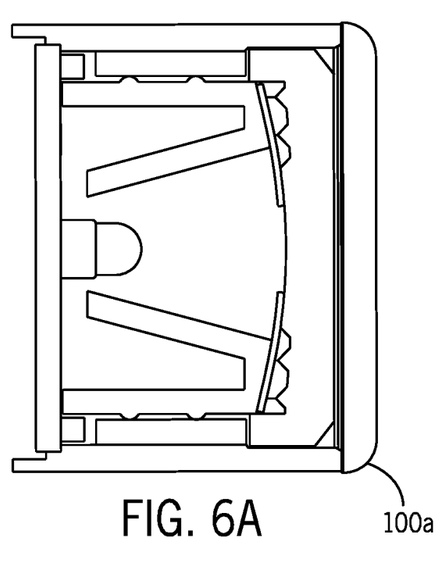
FIG. 6A is a schematic section view of a vehicle interior component according to an exemplary embodiment.
Figure 6B:
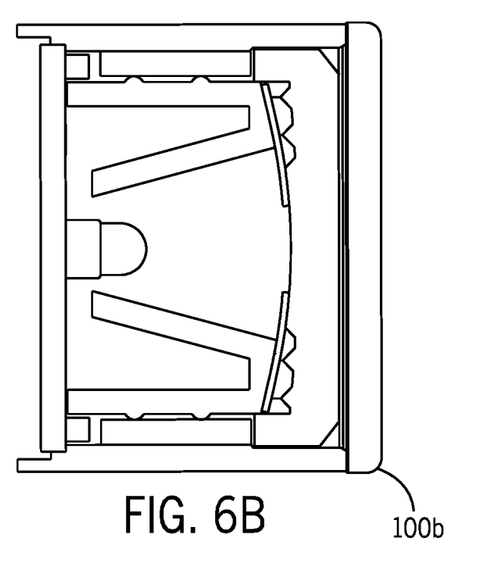
FIG. 6B is a schematic section view of a vehicle interior component according to an exemplary embodiment.
Figure 6C:
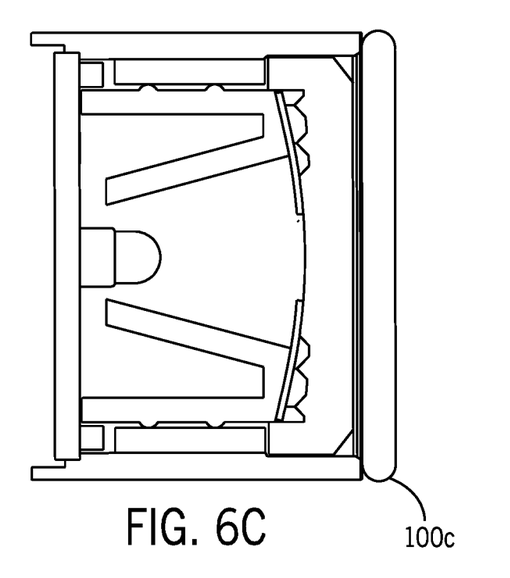
FIG. 6C is a schematic section view of a vehicle interior component according to an exemplary embodiment.
Figure 6D:
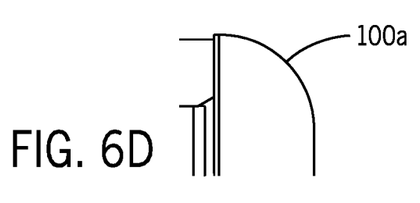
FIG. 6D is a schematic partial section view of a vehicle interior component according to an exemplary embodiment.
Figure 6E:
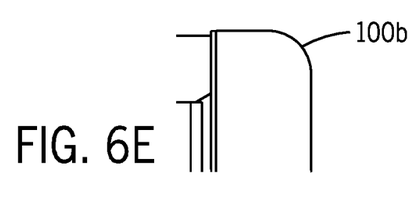
FIG. 6E is a schematic partial section view of a vehicle interior component according to an exemplary embodiment.
Figure 6F:
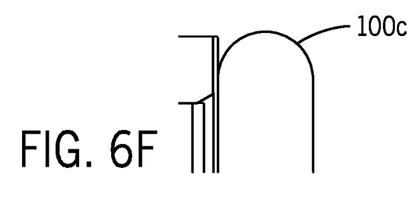
FIG. 6F is a schematic partial section view of a vehicle interior component according to an exemplary embodiment.

According to an exemplary embodiment as shown schematically in FIG. 5, a vehicle interior component 2000 may comprise at least one of (a) a decorative module 400, (b) a light guide 500, (c) a panel 2600, (d) a base 2800, (e) a light source 2900. Vehicle interior component 2000 may further comprise at least one of (a) a cover 100/100a/100b/100c, (b) a mask 200; (c) a sensor 300: (d) an end cap 700. Vehicle interior component 2000 may comprise a trim component, panel, console, etc. provided within a vehicle interior (e.g. instrument panel, door, seat area, cockpit, center area, overhead, etc.).

According to an exemplary embodiment as shown schematically in FIGS. 6A-6F, cover 100/100a/100b/100c may comprise an edge treatment. According to an exemplary embodiment as shown schematically in FIGS. 6A and 6D, edge treatment of cover 100a may comprise at least one of (a) a radiused corner; (b) a bullnose; (c) a demi bullnose. The radiused corner of cover 100a may comprise a radius substantially equal to the thickness of the glass material. According to an exemplary embodiment as shown schematically in FIGS. 6B and 6E, edge treatment of cover 100b may comprise at least one of (a) a radiused corner; (b) a bullnose; (c) a half bullnose. The radiused corner of cover 100b may comprise a radius substantially less than the thickness of the glass material, for example equal to half the thickness of the glass material. According to an exemplary embodiment as shown schematically in FIGS. 6C and 6F, edge treatment of cover 100c may comprise a full bullnose. The full bullnose may comprise a radius substantially equal to half the thickness of the glass material.

Vehicle interior component 1000 and vehicle interior component 2000 may be comprised of cover 100/100a/100b/100c, mask 200, sensor 300, decorative module 400, light guide 500 and end cap 700. Vehicle interior component 1000 may further comprise panel 600, base 800, and light source 900. Vehicle interior component 2000 may further comprise panel 2600, base 2800, and light source 2900.

According to an exemplary embodiment as shown schematically in FIGS. 2, 3A-3C, 4A-4B, 5 and 6A-6F, a vehicle interior component 1000/2000 may be configured to provide light intended to be visible to an occupant in the vehicle when in operation after installation in the interior of the vehicle. Component 1000/2000 may comprise a base 800/2800, a decorative module 400 coupled to base 800/2800 comprising an outer surface 400a and an inner/base surface 400b, a first light source 900a and a second light source 900b. Decorative module 400 may comprise an angled surface 400c configured to direct light L1 from first light source 900a toward inner/base surface 400b of decorative module 400. Inner/base surface 400b of decorative module 400 may be configured to reflect light L1 from first light source 900a. Decorative module 400 may be configured to allow light L2 from second light source 900b to pass through inner/base surface 400b of decorative module 400 toward outer surface 400a of decorative module 400. Inner/base surface 400b of decorative module 400 may comprise a nonplanar surface. Inner/base surface 400b of decorative module 400 may comprise a textured surface. Angled surface 400c of decorative module 400 may comprise at least one of (a) a coating; (b) a film. The at least one of (a) the coating; (b) the film may be configured to reflect light. Vehicle interior component 1000/2000 may comprise a light directing layer 420 coupled to inner/base surface 400b of decorative module 400. Light directing layer 420 may comprise a substantially reflective front side adjacent inner/base surface 400b of decorative module 400 and a substantially transparent back side. Vehicle interior component 1000/2000 may comprise a panel 600/2600 coupled to light directing layer 420. Panel 600/2600 may comprise a substantially opaque portion 600a and a substantially transparent portion 600b. Substantially opaque portion 600a of panel 600/2600 may be configured to reflect light L2 from second light source 900b to prevent light L2 from second light source 900b to pass through inner/base surface 400b of decorative module 400 toward outer surface 400a of decorative module 400. Substantially transparent portion 600b of panel 600/2600 may be configured to allow light L2 from second light source 900b to pass through inner/base surface 400b of decorative module 400 toward outer surface 400a of decorative module 400. Panel 600/2600 may comprise at least one of (a) a film; (b) a foil. Substantially transparent portion 600b of panel 600/2600 may comprise indicia. Decorative module 400 may comprise a light guide. Vehicle interior component 1000/2000 may comprise a cover 100/100a/100b/100c. Cover 100/100a/100b/100c may comprise at least one of (a) glass; (b) plastic; (c) polycarbonate; (d) poly(methyl methacrylate); (e) acrylic; (f) acrylic glass; (g) a transparent thermoplastic material. Cover may comprise an inner surface and an outer surface. The inner surface of cover 100/100a/100b/100c may comprise at least a portion 200 configured to prevent visibility of at least one of (a) the base; (b) the angled surface of the decorative module. Vehicle interior component 1000/2000 may comprise a sensor 300. Sensor 300 may comprise at least one of (a) an electrical circuit; (b) an interactive layer; (c) a capacitive switch; (d) a capacitive switch sensor; (e) a sensor array.

According to an exemplary embodiment as shown schematically in FIGS. 2, 3A-3C, 4A-4B, 5 and 6A-6F, a vehicle interior component 1000/2000 may be configured to provide light L1/L2 from a light source 900/2900 to present a user interface for an occupant of the vehicle. Component 1000/2000 may comprise a base 800/2800 comprising a passage 800a configured for light L2 from light source 900/2900, a light guide 500 adjacent base 800/2800 configured for light L1 from light source 900/2900, a panel 600/2600 comprising indicia 600b aligned with passage 800a, a decorative module 400 providing a core and an inner/base surface 400b, a cover 100/100a/100b/100c providing an exterior surface configured to present the user interface using light from light source 900/2900 and a sensor 600 configured for interaction at the exterior surface. Light guide 500 may comprise a set of light guides 500a/500b along base 800/2800. Light guide 500 may comprise a first light guide 500a and a second light guide 500b separated by decorative module 400. Light guide 500 may be configured to direct light L1 toward decorative module 400. Decorative 400 module may comprise an angled surface 400c configured to direct light L1 from light source 900/2900 toward inner/base surface 400b of decorative module 400. Vehicle interior component 1000/2000 may be configured to present the user interface using light from light source 900/2900 (a) guided through light guide 500 toward decorative module 400, (b) reflected by angled surface 400c of decorative module 400 toward inner/base surface 400b of decorative module 400 and (c) reflected by inner/base surface 400b of decorative module 400 toward sensor 300. Vehicle interior component 1000/2000 may be configured to present the user interface using light from light source 900/2900 (a) guided through passage 800a of base 800/2800 toward indicia 600b of panel 600/2600, (b) guided through indicia 600b of panel 600/2600 toward inner/base surface 400b of decorative module 400 and (c) guided through inner/base surface 400b of decorative module 400 toward sensor 300. Sensor 300 may be configured for interaction in alignment with indicia 600b of panel 600. Light source 900/2900 may comprise a first light source 900a and a second light source 900b. First light source 900a may be configured to direct light L1 toward light guide 500;

second light source 900*b* may be configured to direct light L2 toward indicia 600*b* of panel 600. Cover 100/100*a*/100*b*/100*c* may comprise at least one of (a) glass; (b) plastic; (c) polycarbonate; (d) poly(methyl methacrylate); (e) acrylic; (f) acrylic glass; (g) a transparent thermoplastic material. Cover 100/100*a*/100*b*/100*c* may comprise a glass material in a thickness in a range from greater than 1 mm to about 4 mm and with an edge treatment. The glass material may be hot-formed; the edge treatment may comprise a chamfer; the thickness may be at least 2 mm and generally uniform.

It is important to note that the present inventions (e.g. inventive concepts, etc.) have been described in the specification and/or illustrated in the FIGURES of the present patent document according to exemplary embodiments; the embodiments of the present inventions are presented by way of example only and are not intended as a limitation on the scope of the present inventions. The construction and/or arrangement of the elements of the inventive concepts embodied in the present inventions as described in the specification and/or illustrated in the FIGURES is illustrative only. Although exemplary embodiments of the present inventions have been described in detail in the present patent document, a person of ordinary skill in the art will readily appreciate that equivalents, modifications, variations, etc. of the subject matter of the exemplary embodiments and alternative embodiments are possible and contemplated as being within the scope of the present inventions; all such subject matter (e.g. modifications, variations, embodiments, combinations, equivalents, etc.) is intended to be included within the scope of the present inventions. It should also be noted that various/other modifications, variations, substitutions, equivalents, changes, omissions, etc. may be made in the configuration and/or arrangement of the exemplary embodiments (e.g. in concept, design, structure, apparatus, form, assembly, construction, means, function, system, process/method, steps, sequence of process/method steps, operation, operating conditions, performance, materials, composition, combination, etc.) without departing from the scope of the present inventions; all such subject matter (e.g. modifications, variations, embodiments, combinations, equivalents, etc.) is intended to be included within the scope of the present inventions. The scope of the present inventions is not intended to be limited to the subject matter (e.g. details, structure, functions, materials, acts, steps, sequence, system, result, etc.) described in the specification and/or illustrated in the FIGURES of the present patent document. It is contemplated that the claims of the present patent document will be construed properly to cover the complete scope of the subject matter of the present inventions (e.g. including any and all such modifications, variations, embodiments, combinations, equivalents, etc.); it is to be understood that the terminology used in the present patent document is for the purpose of providing a description of the subject matter of the exemplary embodiments rather than as a limitation on the scope of the present inventions.

It is also important to note that according to exemplary embodiments the present inventions may comprise conventional technology (e.g. as implemented and/or integrated in exemplary embodiments, modifications, variations, combinations, equivalents, etc.) or may comprise any other applicable technology (present and/or future) with suitability and/or capability to perform the functions and processes/operations described in the specification and/or illustrated in the FIGURES. All such technology (e.g. as implemented in embodiments, modifications, variations, combinations, equivalents, etc.) is considered to be within the scope of the present inventions of the present patent document.

The invention claimed is:

1. A vehicle interior component configured to provide light intended to be visible to an occupant in the vehicle when in operation after installation in the interior of the vehicle comprising:
   (a) a base;
   (b) a decorative module coupled to the base comprising an outer surface and an inner surface;
   (c) a first light source;
   (d) a second light source; and
   (e) a light directing layer coupled to the inner surface of the decorative module;
   wherein the decorative module comprises an angled surface configured to direct light from the first light source toward the inner surface of the decorative module;
   wherein the inner surface of the decorative module is configured to reflect light from the first light source;
   wherein the decorative module is configured to allow light from the second light source to pass through the inner surface of the decorative module toward the outer surface of the decorative module;
   wherein the light directing layer comprises a substantially reflective front side adjacent the inner surface of the decorative module and a substantially transparent back side.

2. The component of claim 1 comprising a panel coupled to the light directing layer; wherein the panel comprises a substantially opaque portion and a substantially transparent portion; wherein the substantially opaque portion is configured to reflect light from the second light source to prevent light from the second light source to pass through the inner surface of the decorative module toward the outer surface of the decorative module.

3. The component of claim 2 wherein the substantially transparent portion is configured to allow light from the second light source to pass through the inner surface of the decorative module toward the outer surface of the decorative module.

4. The component of claim 2 wherein the panel comprises at least one of (a) a film; (b) a foil.

5. A vehicle interior component configured to provide light from a light system comprising a light source to provide direct lighting and a light source to provide indirect lighting configured to present a user interface that is illuminated for an occupant of the vehicle comprising:
   (a) a base comprising a passage configured for light from the light source to provide direct lighting;
   (b) a light guide adjacent the base configured for light from the light source to provide indirect lighting;
   (c) a panel comprising indicia aligned with the passage;
   (d) a decorative module providing a core and a base surface;
   (e) a cover providing an exterior surface configured to present the user interface using light from the light source; and
   (f) a sensor configured for interaction at the exterior surface;
   wherein the decorative module comprises an inner surface configured to reflect light from the light source to provide indirect lighting;
   wherein the decorative module comprises a surface configured to direct light from the light source to provide indirect lighting toward the inner surface of the decorative module;

wherein the decorative module is configured to allow light from the light source to provide direct lighting through the passage to the panel comprising indicia aligned with the passage;
so that the user interface is configured to be illuminated by light from the light system comprising direct lighting at the indicia of the panel and indirect lighting at the base surface of the decorative module;
wherein the decorative module comprises (1) a glass surface bonded by an adhesive and (2) a coating to provide a reflective surface for the glass surface;
wherein the indicia comprise printing on the glass surface to cover the reflective surface.

6. The component of claim 5 further comprising light chutes for separate lighting of the indicia.

7. A vehicle interior component configured to provide light intended to present a user interface in the interior of the vehicle comprising:
(a) a base;
(b) a decorative module coupled to the base comprising an outer surface and an inner surface;
(c) a first light source;
(d) a second light source; and
(e) a light-reflecting layer coupled to the inner surface of the decorative module;
wherein the decorative module comprises a surface configured to direct light from the first light source toward the inner surface of the decorative module;
wherein the inner surface of the decorative module is configured to reflect light from the first light source;
wherein the decorative module is configured to allow light from the second light source to pass through the inner surface of the decorative module toward the outer surface of the decorative module;
wherein the light-reflecting layer comprises a substantially reflective front side adjacent the inner surface of the decorative module;
wherein the light-reflecting layer is configured to reflect light from the outer surface and/or the first light source;
wherein the light-reflecting layer is configured to pass light through from the second light source.

8. The component of claim 7 wherein the light reflecting layer comprises a layer applied by a process comprising at least one of (a) metal deposition; (b) vapor deposition; (c) sputtering; (d) physical vapor deposition (PVD); (e) chemical vapor deposition (CVD).

9. A vehicle interior component configured to provide light intended to present a user interface in the interior of the vehicle comprising:
(a) a base;
(b) a decorative module coupled to the base comprising an outer surface and an inner surface;
(c) a first light source;
(d) a second light source;
(e) a light directing layer; and
(e) a panel coupled to the light directing layer;
wherein the decorative module comprises a surface configured to direct light from the first light source toward the inner surface of the decorative module;
wherein the inner surface of the decorative module is configured to reflect light from the first light source;
wherein the decorative module is configured to allow light from the second light source to pass through the inner surface of the decorative module toward the outer surface of the decorative module;
wherein the panel comprises a substantially opaque portion and a substantially transparent portion;
wherein the substantially opaque portion is configured to block light from the second light source or to prevent light from the second light source to pass through the inner surface of the decorative module toward the outer surface of the decorative module.

10. The component of claim 9 wherein the substantially transparent portion is configured to allow light from the second light source to pass through the inner surface of the decorative module toward the outer surface of the decorative module.

11. The component of claim 9 wherein the panel comprises at least one of (a) a film; (b) a foil.

12. A vehicle interior component configured to provide light from a light source comprising a first light source and a second light source to present a user interface comprising symbols for an occupant of the vehicle comprising:
(a) a base comprising passages configured for light from the first light source;
(b) a light guide adjacent the base configured to direct light from the second light source;
(c) a panel comprising indicia aligned with the passage;
(d) a decorative module providing a core and a base surface and a top surface;
(e) a cover providing an exterior surface configured to present the user interface using light from the light source; and
(f) a sensor configured for interaction at the exterior surface;
so that the user interface is configured for interaction by at least one of output by illumination at the decorative module and/or input by detection from the sensor;
wherein the user interface configured to appear at the exterior surface of the cover is configured to present illumination of indicia comprising the symbols to appear at a near distance and illumination of the base surface to appear at a distance beyond the symbols.

13. The component of claim 12 wherein the decorative module comprises an inner surface configured to reflect light from the light source to provide indirect lighting; wherein the decorative module comprises a surface configured to direct light from the light source to provide indirect lighting toward the inner surface of the decorative module; wherein the decorative module is configured to allow light from the light source to provide direct lighting through the passage to the panel comprising indicia aligned with the passage.

14. The component of claim 13 wherein the user interface is configured to be illuminated by light comprising direct lighting at the indicia of the panel and indirect lighting at the base surface of the decorative module.

15. The component of claim 12 wherein the user interface is configured to present illumination of indicia comprising the symbols to appear at a near distance and illumination of the base surface to appear behind the symbols.

16. The component of claim 12 further comprising light chutes for separate lighting of the indicia.

* * * * *